United States Patent
Kim et al.

(10) Patent No.: US 10,211,511 B2
(45) Date of Patent: Feb. 19, 2019

(54) TERAHERTZ DETECTOR USING FIELD-EFFECT TRANSISTOR

(71) Applicant: UNIST (ULSAN NATIONAL INSTITUTE OF SCIENCE AND TECHNOLOGY), Ulsan (KR)

(72) Inventors: Kyung Rok Kim, Ulsan (KR); Min Woo Ryu, Ulsan (KR); Kwan Sung Kim, Ulsan (KR)

(73) Assignee: UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 0 days.

(21) Appl. No.: 15/537,064

(22) PCT Filed: Jan. 23, 2015

(86) PCT No.: PCT/KR2015/000692
§ 371 (c)(1),
(2) Date: Jun. 16, 2017

(87) PCT Pub. No.: WO2016/117724
PCT Pub. Date: Jul. 28, 2016

(65) Prior Publication Data
US 2017/0358840 A1    Dec. 14, 2017

(51) Int. Cl.
*H01L 29/788* (2006.01)
*H01Q 1/22* (2006.01)
(Continued)

(52) U.S. Cl.
CPC .............. *H01Q 1/2283* (2013.01); *G01J 5/20* (2013.01); *G01R 33/00* (2013.01); *G01R 33/066* (2013.01);
(Continued)

(58) Field of Classification Search
CPC ..... H01Q 1/2283; G01J 5/20; H01L 29/41725
See application file for complete search history.

(56) References Cited

U.S. PATENT DOCUMENTS 8,698,226 B2 * 4/2014 Jain ................... H01L 29/66977
257/317
2005/0199917 A1    9/2005 Yoo et al.
(Continued)

FOREIGN PATENT DOCUMENTS

JP    2008026028    2/2008
JP    2014517621    7/2014
(Continued)

OTHER PUBLICATIONS

ISA/KR, International Search Report for PCT/KR2015/000692 dated Oct. 19, 2015.

*Primary Examiner* — Selim U Ahmed
*Assistant Examiner* — Andre' C Stevenson
(74) *Attorney, Agent, or Firm* — Hodgson Russ LLP

(57) ABSTRACT

The purpose of the present invention is to provide a terahertz detector using a field-effect transistor capable of implementing high sensitivity by exhibiting an asymmetric characteristic only with a form of a source/drain and a gate. To this end, the present invention relates to the terahertz detector using a field-effect transistor comprising: a source formed by being doped on a portion of a silicon base; a channel formed so as to encompass the source on a plane; a drain formed outside the channel; a dielectric layer formed on an upper end of the source, the channel and the drain; and a gate located at an upper end of the dielectric layer, wherein when terahertz electromagnetic waves are applied through the gate, the intensity of the electromagnetic waves is detected using a current/voltage outputted from the source and the drain.

5 Claims, 4 Drawing Sheets

(51) Int. Cl.
  *G01R 33/00* (2006.01)
  *G01J 5/20* (2006.01)
  *H01L 27/14* (2006.01)
  *H01L 29/417* (2006.01)
  *H01L 29/423* (2006.01)
  *H01L 29/78* (2006.01)
  *G01R 33/06* (2006.01)
  *H01L 29/06* (2006.01)

(52) U.S. Cl.
  CPC .......... *H01L 27/14* (2013.01); *H01L 29/0692* (2013.01); *H01L 29/41725* (2013.01); *H01L 29/4238* (2013.01); *H01L 29/42316* (2013.01); *H01L 29/7835* (2013.01)

(56) References Cited

U.S. PATENT DOCUMENTS

| | | | |
|---|---|---|---|
| 2008/0042203 | A1 | 2/2008 | Hovel et al. |
| 2009/0230331 | A1 | 9/2009 | Koudymov et al. |
| 2014/0151561 | A1* | 6/2014 | Sherry ................ G05F 3/26 250/340 |
| 2018/0122919 | A1* | 5/2018 | Park ................ H01L 29/66545 |

FOREIGN PATENT DOCUMENTS

| | | |
|---|---|---|
| KR | 1020030083443 | 10/2003 |
| KR | 1020050082758 | 8/2005 |
| KR | 1020130133368 | 12/2013 |
| WO | 2014204394 | 12/2014 |

* cited by examiner

TERAHERTZ DETECTOR USING FIELD-EFFECT TRANSISTOR

TECHNICAL FIELD

The present invention relates to a terahertz detector using a field-effect transistor (FET) and, more particularly, to a terahertz detector of detecting a terahertz electromagnetic wave using an asymmetric FET.

BACKGROUND ART

To increase a sensitivity in a terahertz detector, a charge of a channel may be gathered in a two-dimensional (2D) form by a gate field effect. In general, compound semiconductors have a relatively high efficiency of forming a 2D channel charge as compared to silicon and thus, have been widely used. However, in terms of the compound semiconductors, a manufacturing cost may be higher than that of the silicon and, due to an inconvenience in an etching process for forming a shape, it is difficult to apply various asymmetric structures. Also, when using the compound semiconductors, an integration of peripheral elements such as an antenna and an amplifier may be difficult. For this reason, a commercialization of the compound semiconductor may also be difficult.

In recent years, there has been reported that a performance of a silicon field-effect transistor (FET)-based detector is improved based on increases in performances of an antenna and an amplifier. Basically, since the silicon FET has a low power characteristic, the improvement of the reactivity of the terahertz detector may be limited when the performances of the peripheral elements are improved only.

In general, an FET-based terahertz (THz) detector may allow THz-wave signals corresponding to alternating current signals to be concentrated between two terminals, for example, a gate G and a source S of three external connection terminals, for example, the gate G, the source S, and a drain D of an FET. Through this, the FET-based THz detector may obtain an asymmetry in an amount of charge in a lower semiconductor channel area between the source and the drain. Based on such asymmetric charge distribution, the FET-based THz detector may detect a photoresponse using a direct current (DC) voltage of an output terminal, for example, the drain D, thereby detecting a signal.

As the foregoing, to obtain the asymmetry in the amount of charge for increasing a reactivity of the FET-based THz detector, an efficiency of an antenna for receiving a THz wave may increase and a gain of an amplifier amplifying a voltage of the output terminal, the drain D. Even if the aforementioned scheme is used, the output voltage of the FET that is based on a symmetric structure may be susceptible to noise and thus, a degree of improvement of the reactivity may be relatively small.

When the FET is fabricated in a self-aligned gate structure, which is an advantage of a silicon process, source/drain areas overlapping the gate may need to be asymmetric after the gate has been formed. Also, an additional complex mask process such as an ion implantation process of overlapping for ultrafine and high-performance elements may be required to change either the source/drain areas overlapping the gate. Due to an isotropic diffusion of the ions implanted for such asymmetry, an asymmetry rate of the source/drain facing the gate corresponding to a terminal receiving the THz wave may be reduced and thus, a charge asymmetry effect may be insignificantly high.

A gate sidewall process (of a gate overlapping a lower channel) for underlap for a high-voltage power device may also effectively control the asymmetry effect by adjusting a thickness of a sidewall. In an underlap structure, the asymmetry effect of the gate following a generation of the underlap may be insignificant and a resistance of an element may increase, which may lead to an increase in noise equivalent power.

Although the asymmetric source/drain area is created based on a self-aligned gate structure which is a main method of a typical silicon technology-based FET process, the asymmetric source/drain area facing the gate corresponding to the terminal receiving the THz-wave may have little or no change and thus, the charge asymmetry effect may be significantly reduced. Accordingly, to achieve the asymmetric structure of a channel area between the source and the drain of the silicon-based FET and, simultaneously, effectively realize the asymmetry structure for the source/drain area facing the gate, there is a desire for an additional method differing from a typical self-alignment method. For example, Korean Laid-open Patent No. 2013-0133368 discloses a terahertz detector for maximizing an asymmetry effect.

The aforementioned patent has an advantageous characteristic in configuring a source/drain area in an asymmetric form to increase a sensitivity of a detector. However, an additional process may be required to asymmetrically construct a source/drain and a gate based on a quadrangular shape.

DISCLOSURE OF INVENTION

Technical Goals

An aspect of the present invention provides a terahertz detector using a field-effect transistor which obtains an asymmetry based on shapes of a source/drain, and a gate so as to achieve a high sensitivity.

Technical Solutions

According to an aspect of the present invention, there is provided a terahertz detector using a field-effect transistor, wherein the field-effect transistor includes a source formed on a portion of a silicon base through doping, a channel formed to encompass the source on a plane, a drain formed outside the channel, a dielectric layer formed on the source, the channel and the drain, and a gate provided on the dielectric layer, and wherein when a terahertz electromagnetic wave is applied through the gate, an intensity of the electromagnetic wave is detected using a current/voltage outputted from the source and the drain.

The channel may be formed to have a predetermined width.

The gate may be formed in the same size and shape as the channel.

The gate may be formed in the same shape as the channel and a portion of the gate may overlap the source.

The gate may be formed in the same shape as the channel and a portion of the gate may overlap the drain.

The gate may be formed in the same shape as the channel and a portion of the gate may overlap the source and the drain.

A plane of the source may have a circular shape or a polygonal shape.

Effects

According to an aspect of the present invention, it is possible to provide a terahertz detector using a field-effect transistor in which a channel is formed to encompass a source to obtain an asymmetry based on a geometric form, the asymmetry is additionally obtained by adjusting an overlap area between the channel and a gate, and each parameter defined by a shape is freely set, so as to manufacture the terahertz detector with a high sensitivity.

BEST MODE FOR CARRYING OUT THE INVENTION

Figure 1:
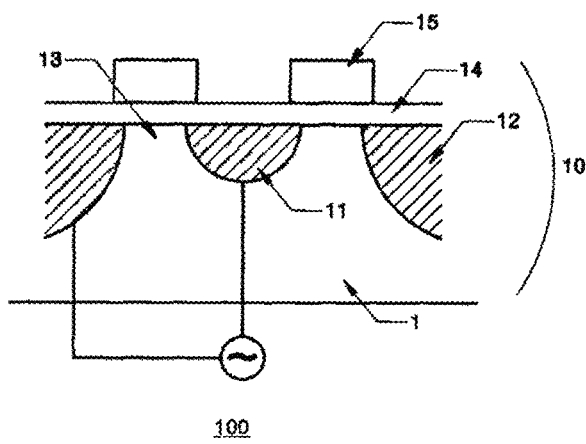
FIG. 1 is a cross-sectional view of a terahertz detector according to the present invention.

Reference will now be made in detail to embodiments of the present invention, examples of which are illustrated in the accompanying drawings, wherein like reference numerals refer to the like elements throughout.

Figure 2:
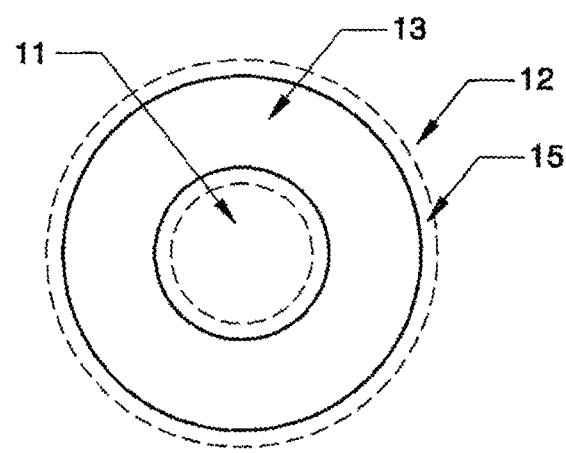
FIG. 2 is a top view of FIG. 1.

Referring to FIGS. 1 and 2, a terahertz detector 100 may be implemented through a unit field-effect transistor (FET) formed on a silicon base 1.

As illustrated in FIG. 1, the FET 10 may include a source 11, a drain 12, a channel 13, a dielectric layer 14, and a gate 15.

An impurity may be doped into each of the source 11 and the drain 12. The dielectric layer 14 and the gate 15 may be formed of materials generally applicable to an FET. A terahertz electromagnetic wave may be applied to the gate 15. In this instance, a property of the terahertz electromagnetic wave applied by a voltage generated between the source 11 and the drain 12 may be detected.

As illustrated in FIG. 2, the source 11 may be formed on a center. The channel 13 may be formed to encompass the source 11.

Thus, the source 11 may be isolatedly provided, and an electrode may be connected via an upper face of the source 11. A cross-section of the source 11 may extend to a lower face of the base 1 such that the electrode is connected via a lower end as necessary.

Figure 3:
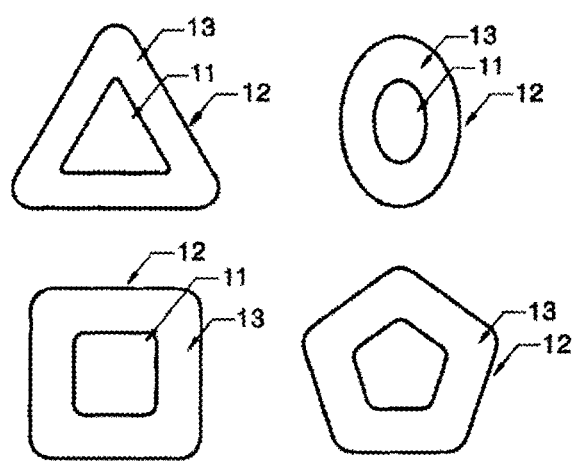
FIG. 3 illustrates examples of FIG. 2.

As illustrated in FIG. 3, the source 11 may be formed in a circular shape, an oval shape, a triangular shape, a quadrangular shape, and the like, and also be formed in a polygonal shape including a pentagon.

An inside of the source 11 and an inside of the drain 12 may be formed in different shapes. For example, the inside of the source 11 may be formed in the triangular shape and the inside of the drain 12 may be formed in the quadrangular shape. In this instance, a thickness of the channel 13 may vary.

Also, depending on examples, the inside of the source 11 and the inside of the drain 12 may have the same shape and origins at different positions. In this instance, the thickness of the channel 13 may also vary.

When the channel 13 is provided with a predetermined width to encompass the source 11, the channel 13 may be formed to have the same shape as the source 11. Also, in terms of fabrication, it is advantageous to provide the channel 13 with the predetermined width.

Since the drain 12 is configured based on an area excluding the source 11 and the channel 13, a geometrical asymmetry may be achieved when the source 11 is isolatedly provided as described above.

The gate 15 may be disposed on the dielectric layer 14 and have the same shape as the channel 13. The gate 15 may have a portion overlapping the source 11 and the drain 12. The overlapping portion may additionally increase the asymmetry.

Figure 4:
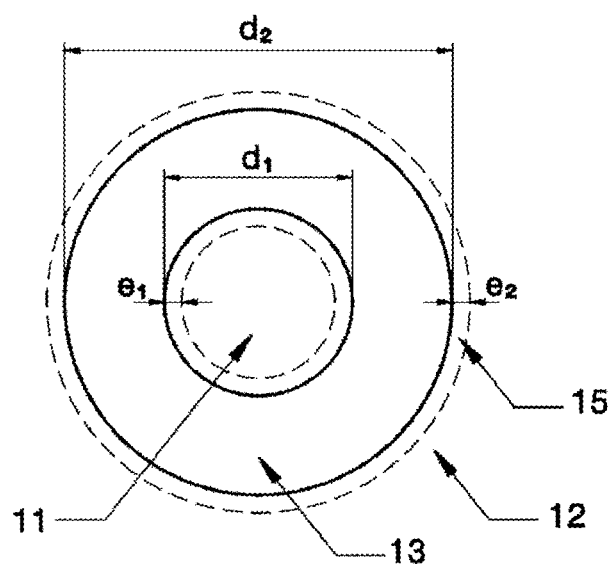
FIG. 4 illustrates an example of size definition of FIG. 2.

When the source 11 is formed in the circular shape, the gate 15 may be formed in a ring shape. As illustrated in FIG. 4, when a diameter of the source 11 is d1, an outer diameter of the channel 13 is d2, an overlap area between the gate 15 and the source 11 is e1, and an overlap area between the gate 15 and the drain 12 is e2, the asymmetry of the FET 10 may be represented by an equation as below.

In this example, when a length of the source 11 corresponding to one end of the channel 13 is Ws and a length of the drain 12 corresponding to another end of the channel 13 is Wd, a width asymmetry may be defined as a length ratio:

Width asymmetry=Wd/Ws
=$\pi$d2/$\pi$d1
=d2/d1

Also, the gate 15 may have an area asymmetry based on the overlapping. The asymmetry of the gate 15 may be defined as a ratio of the overlap area between the gate 15 and the drain 12 to the overlap area between the gate 15 and the source 11.

The area asymmetry may be calculated as follows.

Area asymmetry=overlap area between the drain 12 and the gate 15/overlap area between the source 11 and the gate 15

Overlap area between the source 11 and the gate 15=$\pi(d1/2)^2 - \pi(d1/2 - e\pi e1)^2$ Overlap area between the drain 12 and the gate 15=$\pi(d2/2+e2)^2 - \pi(d2/2)^2$ Thus, area asymmetry=$(d2e2+e2^2)/(d1e1-e1^2)$ Here, if e1=e2=e, that is, when the overlap areas are the same, the area asymmetry may be defined as "area asymmetry=$(d2+e)/(d1-e)$".

As the foregoing, since the asymmetry is achieved based on an FET plane shape, the terahertz detector 100 may maintain a sufficient sensitivity without setting for the asymmetry.

In this example, when a difference between d1 and d2 increases, the width asymmetry may increase. Also, when an overlap value e increases, the area asymmetry may increase. Thus, it is possible to manufacture the terahertz detector 100 having various characteristics by adjusting values of d1, d2, e1, and e2.

As described above, the terahertz detector 100 may be configured based on silicon process technology. An integration of the terahertz detector 100 with peripheral elements such as an antenna configured to receive a terahertz-wave signal to allow the terahertz-wave signal to flow between an electrode of the gate 15 and an electrode of the source 11, and an amplifier configured to detect output voltage/current between the electrode of the source 11 and a metal electrode of the drain 12 may be implemented on a single silicon substrate based on low-cost silicon process technology. Also, high-sensitivity silicon-based large-area multi-pixel array type detector integration may be realized at low costs based on the low-cost silicon process technology.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. A terahertz detector using a field-effect transistor, wherein the field-effect transistor includes:
   a source formed on a portion of a silicon base through doping;
   a channel formed to encompass the source on a plane;
   a drain formed outside the channel;
   a dielectric layer formed on the source, the channel and the drain; and
   a gate provided on the dielectric layer, and
   wherein when a terahertz electromagnetic wave is applied through the gate, an intensity of the electromagnetic wave is detected using a current/voltage outputted from the source and the drain;
   wherein a plane of the source has a circular or a polygonal shape, and an outer perimeter edge of the channel is offset from an outer perimeter edge of the source by a fixed width to produce geometric asymmetry between the source and the drain.

2. The terahertz detector of claim 1, wherein the gate is formed in the same size and shape as the channel.

3. The terahertz detector of claim 1, wherein the gate is formed in the same shape as the channel and a portion of the gate overlaps the source.

4. The terahertz detector of claim 1, wherein the gate is formed in the same shape as the channel and a portion of the gate overlaps the drain.

5. The terahertz detector of claim 1, wherein the gate is formed in the same shape as the channel and a portion of the gate overlaps the source and the drain.

* * * * *